(12) United States Patent
Ohtoyo et al.

(10) Patent No.: US 6,892,579 B2
(45) Date of Patent: *May 17, 2005

(54) ACCELERATION SENSOR

(75) Inventors: Daigo Ohtoyo, Mohka (JP); Masakatsu Saitoh, Yokohama (JP)

(73) Assignee: Hitachi Metals, LTD, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/733,643

(22) Filed: Dec. 12, 2003

(65) Prior Publication Data

US 2004/0123664 A1 Jul. 1, 2004

(30) Foreign Application Priority Data

Dec. 19, 2002 (JP) ........................................ 2002-367835

(51) Int. Cl.$^7$ .............................................. G01P 15/12
(52) U.S. Cl. .................................................. 73/514.33
(58) Field of Search ........................ 73/514.33, 514.34, 73/514.36, 514.38, 493

(56) References Cited

U.S. PATENT DOCUMENTS

| | | | | |
|---|---|---|---|---|
| 5,485,749 A | * | 1/1996 | Nohara et al. | ........... 73/514.33 |
| 6,089,093 A | * | 7/2000 | Lefort et al. | ............. 73/514.33 |
| 6,263,735 B1 | * | 7/2001 | Nakatani et al. | ......... 73/514.36 |
| 6,293,149 B1 | * | 9/2001 | Yoshida et al. | .......... 73/514.01 |

FOREIGN PATENT DOCUMENTS

| | | |
|---|---|---|
| JP | 04-274005 | 9/1992 |
| JP | 05-041148 | 2/1993 |
| JP | 08-233851 | 9/1996 |

* cited by examiner

Primary Examiner—Helen Kwok
(74) Attorney, Agent, or Firm—Sughrue Mion, PLLC

(57) ABSTRACT

An acceleration sensor is disclosed that has a structure in which elastic support arms are not broken even if subjected to an impact that may be caused during a usual handling. The acceleration sensor comprises a mass portion, a mass portion top plate fixed onto the mass portion, a rectangular thick support frame surrounding the mass portion, a frame top plate fixed onto the frame, and four elastic support arms hanging the mass portion in the center of the frame and bridging the mass portion top plate and the frame top plate. There are provided lateral grooves just below the support arms on side surfaces of the mass portion and on inner side surfaces of the frame. Due to the grooves, the mass portion top plate and the frame top plate have their portions bonded to the mass portion/the frame and their portions protruding toward the support arms. Cross sections on boundaries between the bonded portions and the protruding portions are larger than those connecting the protruding portions to the support arms. Breakage of the elastic support arms is prevented, because the strain caused in the mass portion/the frame by an impact applied from outside is not directly transmitted to the support arms and is released in the protruding portions having a larger cross section than the support arms.

19 Claims, 11 Drawing Sheets

ACCELERATION SENSOR

BACKGROUND OF THE INVENTION

1. Field of the Invention

The present invention relates to an acceleration sensor for detecting acceleration, which is used for toys, automobiles, aircrafts, portable terminals and the like, and particularly to an acceleration sensor that can be produced using a semiconductor technology.

2. Description of the Related Art

Acceleration sensors utilizing a change in physical quantity such as a piezo resistance effect and a change in electrostatic capacity have been developed and commercialized. These acceleration sensors can be widely used in various fields, but recently, such small-sized acceleration sensors as can detect the acceleration in multi-axial directions at one time with high sensitivity are demanded.

Since silicon single crystal becomes an ideal elastic body due to the extreme paucity of lattice defect and since a semiconductor process technology can be applied for it without large modification, much attention is paid to a piezo resistance effect type semiconductor acceleration sensor in which a thin elastic support portion is provided at a silicon single crystal substrate, and the stress applied to the thin elastic support portion is converted into an electric signal by a strain gauge, for example, a piezo resistance effect element, to be an output.

As a three-dimensional acceleration sensor, an acceleration sensor has been used, which comprises elastic support arms each of a beam structure formed by a thin portion of a silicon single crystal substrate connecting a mass portion constituted by a thick portion of a silicon single crystal substrate in a center and a frame in its periphery. A plurality of strain gauges are formed in each axial direction on the elastic support arms. In order to sense a small acceleration with an enhanced sensitivity, the elastic support arms are made long and/or thin, or the mass portion that works as a pendulum is made heavy. The acceleration sensor that can detect a small acceleration has led to an excessive amplitude of the mass portion, when subjected to a large impact, and resulted to break the elastic support arms. To avoid the break of the elastic support arms even if a massive impact is applied, regulation plates have been installed above and below the acceleration sensor element to restrict amplitude of the mass portion within a certain range.

An acceleration sensor having regulation plates is described in Japanese Laid-Open Patents HEI 4-274005, HEI 5-41148 and HEI 8-233851.

Japanese Laid-Open Patents HEI 4-274005 and HEI 8-233851 also disclose a method in which, to control a gap at a predetermined value between the regulation plates and the mass portion of the acceleration sensor element, small balls having a diameter of substantially the same distance as a gap are mixed with adhesive, and the adhesive with small balls mixed is used to bond regulation plates to the acceleration sensor element. The gap can be maintained at a predetermined value because the gap between regulation plates and the acceleration sensor element can be dictated by a diameter of small balls. The use of adhesive containing small balls thus enables the control of a gap between regulation plates and the acceleration sensor element.

Although such an excessive amplitude of the mass portion caused by a large acceleration can be prevented by the regulation plates mounted over/below the acceleration sensor as described in the Japanese patent documents, the elastic support arms may be broken when subjected to such a large impact. Especially an acceleration sensor for measuring as a small acceleration as less than 2 G has thin and narrow elastic support arms having a small cross sectional area and a long arm, while its mass portion is made heavy, in order to ensure to have an enhanced sensitivity. So, the elastic support arms may often be broken when an impact is applied. To prevent such breakage, the elastic support arms may be made thick but it will cause to reduce the sensitivity of the acceleration sensor.

SUMMARY OF THE INVENTION

An object of the invention, therefore, is to provide an acceleration sensor having a structure in which elastic support arms are not broken even if it is subjected to such an impact that will be applied during a usual handling, while the acceleration sensor maintains an enhanced sensitivity to acceleration.

Another object of the invention is to provide an acceleration sensor having a structure in which an excessive vibration of a mass portion caused by a large acceleration is suppressed by regulation plates mounted over and below the acceleration sensor element and in which elastic support arms are not broken when subjected to such an impact that will be applied during a usual treatment.

An acceleration sensor of the invention comprises an acceleration sensor element. The acceleration sensor element comprises:

a mass portion located in the center of the acceleration sensor element;

a top plate of the mass portion fixed on an upper end of the mass portion;

a rectangular thick support frame surrounding and being at a distance from the mass portion;

a top plate of the frame fixed on an upper end of the frame;

four elastic support arms bridging the mass portion top plate and the frame top plate and hanging the mass portion in the center of the frame; and strain gauges formed on the elastic support arms.

In the acceleration sensor element, the mass portion top plate has a portion bonded to the mass portion upper end and a portion protruding toward each of the elastic support arms from the bonded portion of the mass portion top plate. A cross section of the mass portion top plate on a boundary between the bonded portion and the protruding portion is larger than a cross section connecting the protruding portion to the elastic support arm. The frame top plate has a portion bonded to the frame upper end and a portion protruding toward each of the elastic support arms from the bonded portion of the frame top plate. A cross section of the frame top plate on a boundary between the bonded portion and the protruding portion is larger than a cross section connecting the protruding portion to the elastic support arm.

In the acceleration sensor, it is preferable that the protruding portion of the mass portion top plate is formed from the mass portion top plate by a groove provided on a side surface of the mass portion neighboring on the upper end of the mass portion along the mass portion top plate between the mass portion top plate and the mass portion upper end, and that the protruding portion of the frame top plate is formed from the frame top plate by a groove provided on an inner side surface of the frame neighboring on the upper end of the frame along the frame top plate between the frame top plate and the frame upper end.

In the acceleration sensor, it is preferable that a surface of the mass portion top plate facing the mass portion upper end is substantially the same in shape and in area as a region surrounded by crossing lines of a plane including the mass portion upper end with planes extended along the side surfaces of the mass portion toward the mass portion top plate from the side surfaces of the mass portion, and that a surface of the frame top plate facing the frame upper end is substantially the same in shape and in area as a region provided between crossing lines of a plane including the frame upper end with planes extended along the inner side surfaces of the frame toward the frame top plate from the inner side surfaces of the frame and crossing lines of a plane including the frame upper end with planes extended along outer side surfaces of the frame toward the frame top plate from the outer side surfaces of the frame.

In the acceleration sensor, it is preferable that each of the grooves is equal to or longer than the width of the elastic support arm neighboring on the groove, and is 1 to 30 μm wide and 1 to 100 μm deep.

An acceleration sensor of the invention may comprise an acceleration sensor element which comprises:
- a square mass portion located in the center of the acceleration sensor element;
- a square top plate of the mass portion fixed on an upper end of the mass portion;
- a square thick support frame surrounding and being at a distance from the mass portion;
- a square top plate of the frame fixed on an upper end of the frame;
- four elastic support arms bridging the mass portion top plate and the frame top plate and hanging the mass portion in the center of the frame; and
- strain gauges formed on the elastic support arms.

And in the acceleration sensor, the mass portion top plate has a portion bonded to the mass portion upper end and a portion protruding toward each of the elastic support arms from the bonded portion of the mass portion top plate. A cross section of the mass portion top plate on a boundary between the bonded portion and the protruding portion is larger than a cross section connecting the protruding portion to the elastic support arm. The frame top plate has a portion bonded to the frame upper end and a portion protruding toward each of the elastic support arms from the bonded portion of the frame top plate. A cross section of the frame top plate on a boundary between the bonded portion and the protruding portion is larger than a cross section connecting the protruding portion to the elastic support arm.

In the square acceleration sensor, it is preferable that the protruding portion of the mass portion top plate is formed from the mass portion top plate by a groove provided on a side surface of the mass portion neighboring on the upper end of the mass portion along the mass portion top plate between the mass portion top plate and the mass portion upper end, and that the protruding portion of the frame top plate is formed from the frame top plate by a groove provided on an inner side surface of the frame neighboring on the upper end of the frame along the frame top plate between the frame top plate and the frame upper end.

In the square acceleration sensor, it is preferable that a surface of the square mass portion top plate facing the mass portion upper end is substantially the same in shape and in area as a cross section of other part of the square mass portion than the grooves on the mass portion, the cross section being parallel to the upper end of the mass portion, and that a surface of the square frame top plate facing the frame upper end is substantially the same in shape and in area as a cross section of other part of the square frame than the grooves on the frame, the cross section being parallel to the upper end of the frame.

In the square acceleration sensor, it is preferable that each of the grooves is equal to or longer than the width of the elastic support arm neighboring on the groove, and is 1 to 30 μm wide and 1 to 100 μm deep.

An acceleration sensor of the invention may comprises:
- the acceleration sensor element,
- a first regulation plate mounted with a predetermined gap with the mass portion top plate to cover the acceleration sensor element and fixed on a top surface of the frame top plate by a paste, and
- a second regulation plate to which a bottom surface of the frame is bonded by the paste with a second predetermined gap between a bottom surface of the mass portion and a top surface of the second regulation plate. The paste is a mixture of hard plastic balls with adhesive.

The acceleration sensor may further comprise a protection case having a side frame and an inner bottom plate surrounded by the side frame. The acceleration sensor element is installed in the protection case, in which the inner bottom plate working as the second regulation plate.

In the acceleration sensor, it is preferable that the protruding portion of the mass portion top plate is formed from the mass portion top plate by a groove provided on a side surface of the mass portion neighboring on the upper end of the mass portion along the mass portion top plate between the mass portion top plate and the mass portion upper end, and that the protruding portion of the frame top plate is formed from the frame top plate by a groove provided on an inner side surface of the frame neighboring on the upper end of the frame along the frame top plate between the frame top plate and the frame upper end.

In the acceleration sensor, it is preferable that a surface of the mass portion top plate facing the mass portion upper end is substantially the same in shape and in area as a region surrounded by crossing lines of a plane including the mass portion upper end with planes extended along the side surfaces of the mass portion toward the mass portion top plate from the side surfaces of the mass portion, and that a surface of the frame top plate facing the frame upper end is substantially the same in shape and in area as a region provided between crossing lines of a plane including the frame upper end with planes extended along the inner side surfaces of the frame toward the frame top plate from the inner side surfaces of the frame and crossing lines of a plane including the frame upper end with surfaces extended along outer side surfaces of the frame toward the frame top plate from the outer side surfaces of the frame.

In the acceleration sensor, it is preferable that each of the grooves is equal to or longer than the width of the elastic support arm neighboring on the groove, and is 1 to 30 μm wide and 1 to 100 μm deep.

DETAILED DESCRIPTION OF THE PREFERRED EMBODIMENTS

EXAMPLE 1

Figure 1:
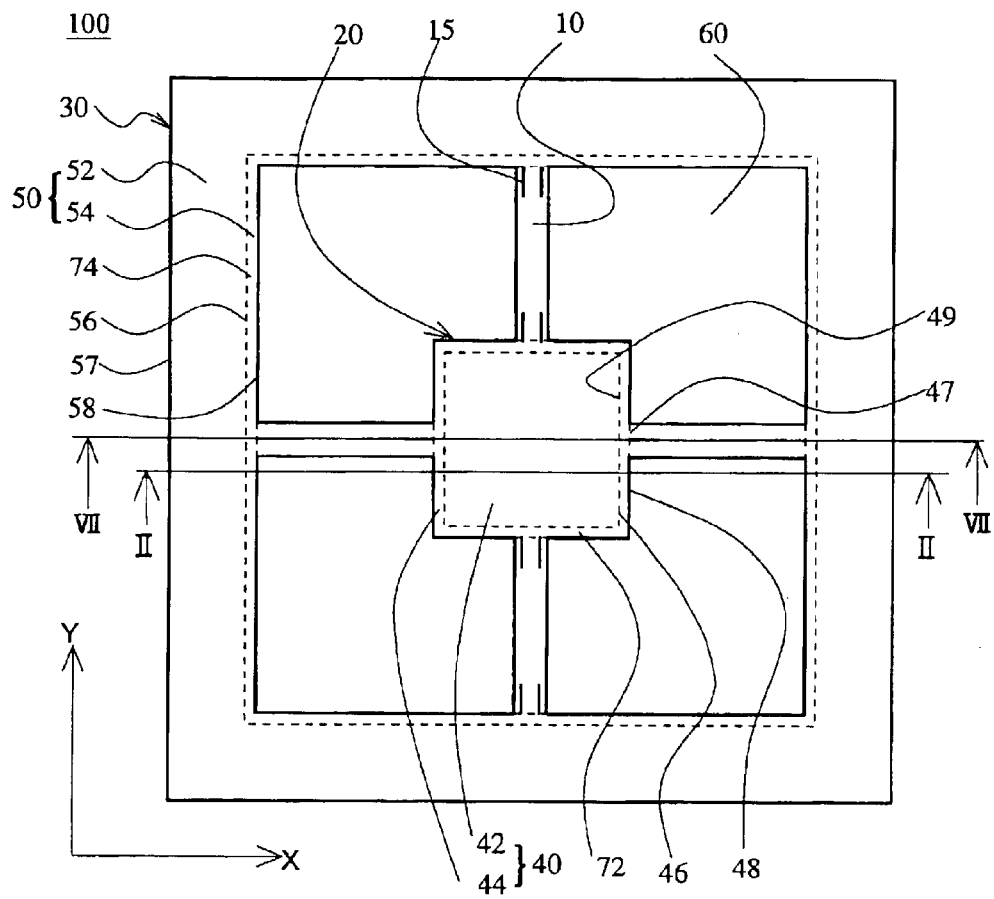
FIG. 1 is a plan view of a semiconductor acceleration sensor element of a first embodiment of the invention.
Figure 2:
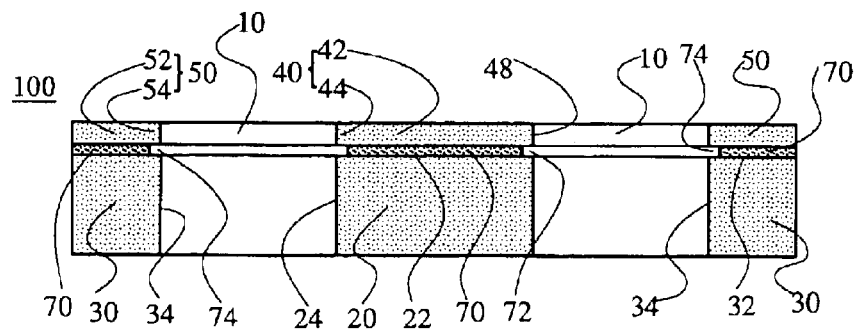
FIG. 2 is a cross sectional view taken along the line II—II of FIG. 1.
Figure 3:
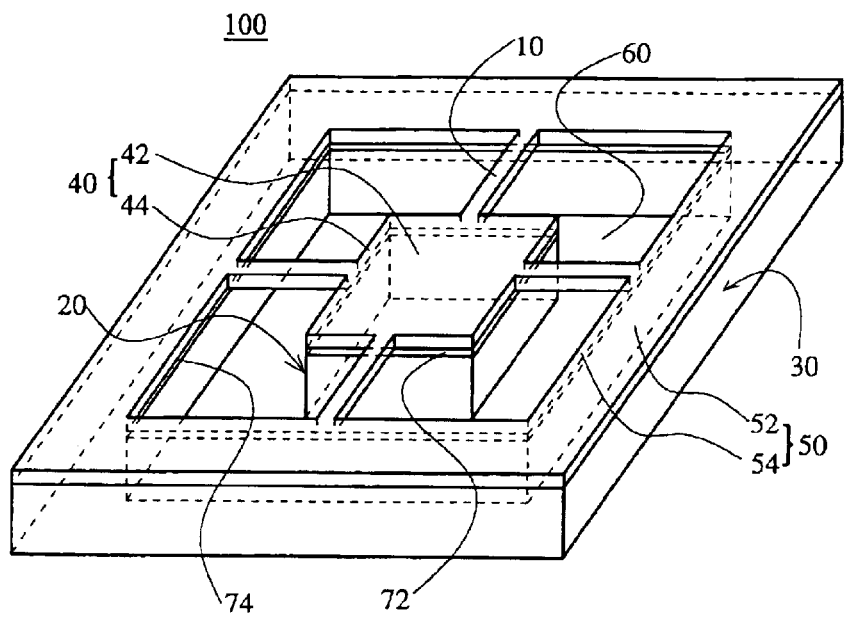
FIG. 3 is a perspective view of the acceleration sensor element shown in FIG. 1.
Figure 4:
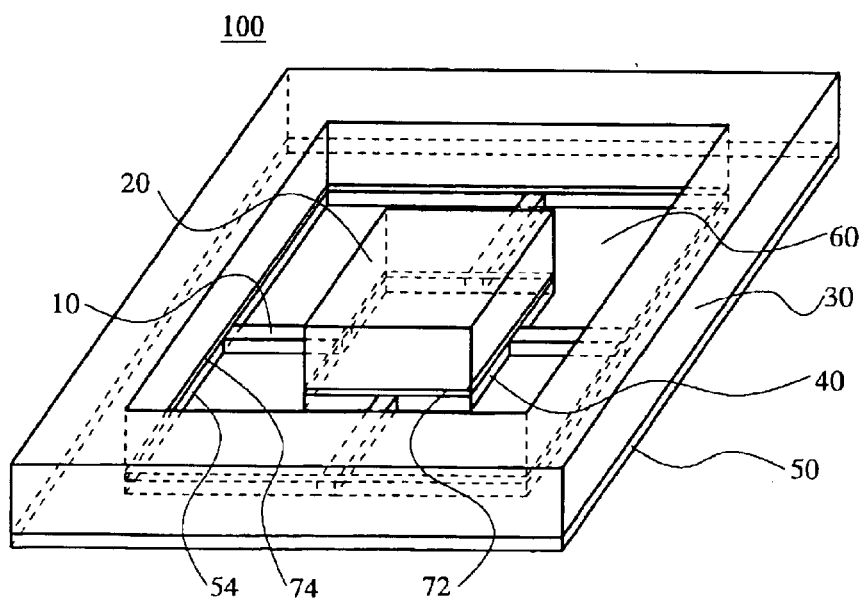
FIG. 4 is an upended perspective view of the acceleration sensor element of FIG. 3.
Figure 5:
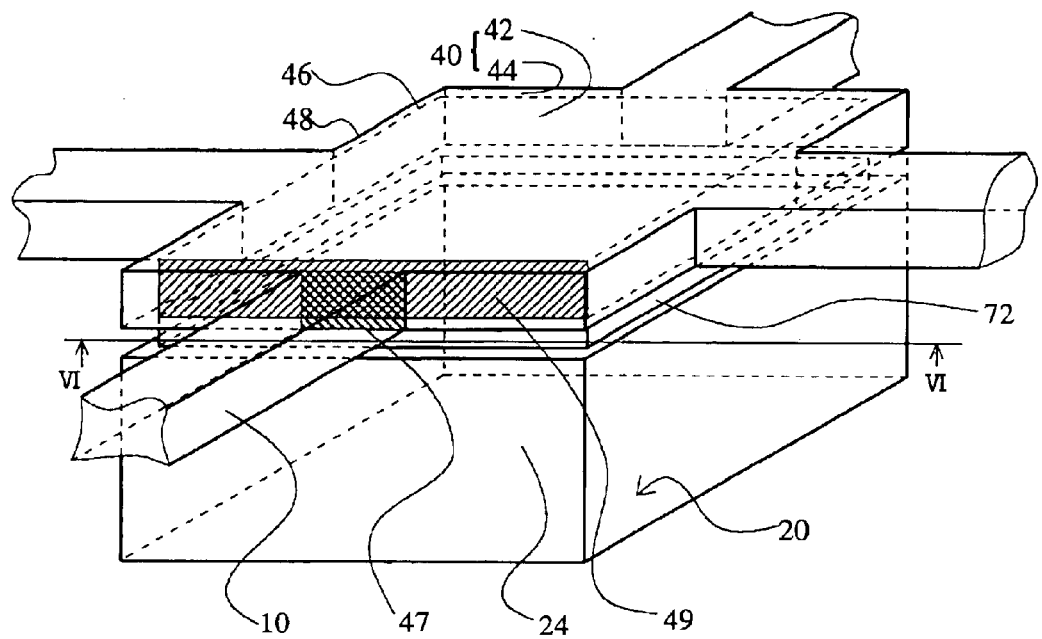
FIG. 5 is an enlarged explanatory perspective view of part of the acceleration sensor element of FIG. 3.
Figure 6:
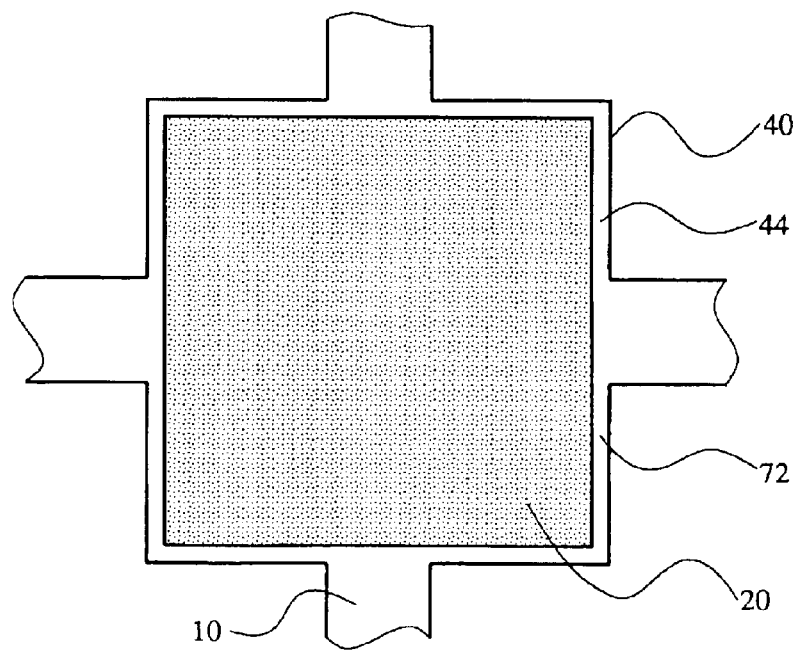
FIG. 6 is an enlarged cross sectional plan view taken along the line VI—VI of FIG. 5.

The first embodiment of the invention will be explained, referring to FIGS. 1 through 6. FIG. 1 is a plan view of a semiconductor acceleration sensor element 100 of the first embodiment, FIG. 2 is a cross sectional view taken along the line II—II of FIG. 1, FIG. 3 is a perspective view of the acceleration sensor element shown in FIG. 1, FIG. 4 is an upended perspective view of the acceleration sensor element of FIG. 3, FIG. 5 is an enlarged perspective view of part of FIG. 3, and FIG. 6 is an enlarged cross sectional plan view taken along the line VI—VI of FIG. 5.

The acceleration sensor element 100 for the present invention uses a silicon single crystal substrate with an SOI layer being formed via a SiO$_2$ insulation layer, namely, an SOI wafer, in order to make it possible to control the thickness of elastic support arms with high precision. The SOI is an abbreviation of Silicon On Insulator. In this example, a wafer formed by thinly forming the SiO$_2$ insulation layer being an etching stopper (about 10 $\mu$m) on a Si substrate with thickness of about 600 $\mu$m, on which an N-type silicon single crystal layer with thickness of about 6 $\mu$m is formed, is used as a substrate. The acceleration sensor element 100 is constituted by a mass portion 20 in a center, which is constituted by a thick portion of the silicon single crystal substrate; a top plate 40 of the mass portion fixed on the upper end of the mass portion; a square-shaped frame 30 placed around the mass portion 20 to surround it; a top plate 50 of the frame fixed on the upper end of the frame; and two pairs of beam-shaped elastic support arms 10 that are constituted by thin portions of the silicon single crystal substrate to connect the mass portion 20 and the frame 30. Strain gauges (in the following explanation, "piezoresistors" as an example of the strain gauge is used, and therefore they are called "piezoresistors") 15, four of which are for each axis, are placed on the elastic support arms 10 correspondingly to two detection axes (X and Y axes) perpendicular to each other and the detection axis (Z axis) orthogonal to the top surface of the acceleration sensor element. Namely, the two piezoresistors 15 are provided on each of the elastic support arms 10 extending in the X-axis direction to detect the acceleration in the X-axis direction. The two piezoresistors 15 are provided on each of the elastic support arms 10 extending in the Y-axis direction to detect the acceleration in the Y-axis direction. Further two piezoresistors 15 are provided on each of the elastic support arms 10 extending in the X-axis direction to detect the acceleration in the Z-axis direction. The Z-axis is not shown in FIG. 1 since it is perpendicular to the sheet surface. In this example, the acceleration in the Z-axis direction is detected by the piezoresistors 15 provided on the elastic support arms 10 extending in the X-axis direction, but the resistors for detecting the acceleration in the Z-axis direction may be provided on the elastic support arms 10 extending in the Y-axis direction. Four of the piezoresistors 15 for detecting the acceleration in each axis direction construct a full bridge detection circuit.

A plurality of input/output terminals are provided on the top surface of the frame top plate 50 fixed onto the upper end 32 of the thick support frame in the acceleration sensor element 100. The input/output terminals are connected to terminals of twelve piezoresistors on the elastic support arms by a plurality of conductors provided from the top surfaces of the elastic support arms to the top surface of the frame top plate. FIG. 1 does not show the plural input/output terminals and the plural conductors but the piezoresistors. In other figures, the piezoresistors are also omitted.

The acceleration sensor element 100 according to the embodiment is manufactured from an SOI wafer, in which the mass portion 20 and the thick support frame 30 are made of a Si substrate of about 600 $\mu$m thick. And, the mass portion top plate 40, the four elastic support arms 10 and the frame top plate 50 are integrally made from a silicon single crystal layer of about 6 $\mu$m thick. In the SOI wafer, the silicon single crystal layer is fixed onto the Si substrate through a SiO$_2$ insulating layer. So, the mass portion top plate 40 and the frame top plate 50 are fixed onto an upper end 22 of the mass portion and the upper end 32 of the thick support frame, respectively, by an adhesion layer 70 or the SiO$_2$ insulating layer. Since the mass portion 20 and the mass portion top plate 40 fixed to the upper end 22 of the mass portion are manufactured from the Si substrate 80 and the silicon single crystal layer 90 fixed onto the substrate, respectively, by the $SiO_2$ insulating layer 70, a surface of the mass portion top plate 40 facing the mass portion 20 is substantially the same in shape and in size as a horizontal cross section of the mass portion. A surface of the frame top plate 50 facing the frame is substantially the same in shape and in size as a horizontal cross section of the frame, since the thick support frame 30 and the top plate 50 fixed onto the upper end of the frame are made, respectively, of the Si substrate 80 and the silicon single crystal layer 90 fixed on it by the $SiO_2$ insulating layer 70. In this embodiment, the mass portion 20 and the frame 30 have substantially the same cross sections throughout their heights, from their tops to their bottoms, so that the mass portion top plate 40 and the frame top plate 50 are substantially the same as the upper end surface 22 of the mass portion and the upper end surface 32 of the frame, respectively.

Through-holes 60 are provided inside of the square support frame 30, except for the mass portion 20 and the elastic support arms 10. The elastic support arms 10, which are made of the 6 μm thick silicon single crystal layer 90 left from the SOI wafer after the parts of the Si substrate 80 and the $SiO_2$ insulating layer 70 are removed, bridge the square support frame 30 and the mass portion 20.

The top plate 40 of the mass portion fixed onto the upper end 22 of the mass portion has a portion 42 bonded to the mass portion upper end 22 through adhesion layer 70 and portions 44 each protruding toward each of the elastic support arms from the bonded portion 42. As shown in the drawings, since the adhesion layer 70 that bonds the mass portion top plate 40 to the mass portion 20 is narrowed by being shaved from the outskirt of the layer, part of the mass portion top plate 40 without the adhesion layer protrudes toward each of the elastic support arms 10 over the mass portion 20 like the eaves. In FIG. 1, the portion 42 of the mass portion top plate 40 bonded to the mass portion upper end is a region surrounded by a dotted line 46, while the protruding portion 44 is a narrow region between the dotted line 46 and outer sides 48 of the mass portion top plate 40.

A cross section on which the protruding portion 44 connects to the elastic support arm 10 is a region 47 hatched with diagonal lines from upper left to lower right in FIG. 5 and the area of the cross section is the same as the cross section of the elastic support arm 10 and a product of the thickness (defined by the thickness of the mass portion top plate) of the elastic support arm 10 and the width of the arm 10. On the other hand, a cross section of the top plate 40 on the boundary between the bonded portion 42 and the protruding portion 44 of the mass portion top plate 40 is a region 49 hatched with diagonal lines from upper right to lower left in FIG. 5 and the area is a product of the thickness of the mass portion top plate 40 and a side length of the adhesion layer.

For explaining the cross section area of the elastic support arms 10 and the cross section area of the mass portion top plate 40 on the boundary between the bonded portion 42 and the protruding portion 44, the acceleration sensor element 100 according to the first embodiment will be explained dimensionally. The side length of the square acceleration sensor element 100 is about 3,300 μm, while the thick support frame 30 has a thickness of about 600 μm and a width of about 450 μm. The mass portion 20 in the center has a side of about 1,000 μm in length and a thickness of about 600 μm. The four elastic support arms 10 are about 700 μm long and about 110 μm wide. The mass portion top plate 40 has the same in length as the mass portion 20 that is about 1,000 μm long. The top plate 50 of the thick support frame is the same in size as the thick support frame 30 and is a square of about 3,300 μm in side length and about 2,400 μm in inner side length. Since the elastic support arms 10, the mass portion top plate 40 and the frame top plate 50 are made of the silicon layer on the $SiO_2$ insulating layer, they are about 6 μm thick. The adhesion layer 70 made of the $SiO_2$ insulating layer is about 10 μm thick.

The adhesion layer 70 bonding the mass portion top plate 40 onto the upper end 22 of the mass portion is removed by about 10 μm in depth from the periphery of the layer on which lateral grooves 72 are formed along the boundary between the mass portion upper end 22 and the mass portion top plate on the side surfaces 24 of the mass portion. The grooves 72 have the same length as the sides of the mass portion 20 and the same width as the thickness of the $SiO_2$ insulating layer 70. In the embodiment, the grooves 72 are about 1,000 μm long, about 10 μm wide and about 10 μm deep. By the grooves 72, the protruding portions 44 of the mass portion top plate 40 are formed from the top plate 40. The cross section (the region 49 hatched from upper right to lower left in FIG. 5) of the mass portion top plate on the boundary between the bonded portion 42 and the protruding portion 44 of the mass portion top plate 40 is about 6,000 $μm^2$ in area, since the thickness is about 6 μm and the length is about 1,000 μm, in precise it is about 980 μm, the value obtained by subtraction of groove depth on both sides from the side length. The cross section 47 connecting the elastic support arm 10 to the protruding portion 44 of the mass portion top plate 40 is about 660 $μm^2$ in area. So, the cross section area on the boundary between the bonded portion 42 and the protruding portion 44 of the mass portion top plate 40 is larger than the cross section area of the elastic support arms.

As in the similar way, the adhesion layer 70 bonding the frame top plate 50 onto the upper end 32 of the thick support frame is removed by about 10 μm in depth from the periphery of the layer on which lateral grooves 74 are formed along the boundary between the frame upper end 32 and the frame top plate 50 on the inner side surfaces 34 of the frame. The grooves 74 have the same length as the inner side 34 of the frame and the same width as the thickness of the $SiO_2$ insulating layer 70. In this embodiment, the grooves 74 are about 2,400 μm long, about 10 μm wide and about 10 μm deep. By the grooves, the protruding portions 54 of the frame top plate 50 are formed from the frame top plate 50.

The frame top plate 50 fixed onto the upper end 32 of the thick support frame has the portion 52 bonded to the frame upper end 32 through the adhesion layer 70 and the portions 54 protruding toward the elastic support arms 10 from the bonded portion 52. As shown in the drawings, the frame top plate 50 extends toward each of the elastic support arms over parts without adhesion layer of the frame like the eaves, since the adhesion layer 70 bonding the frame top plate 50 to the frame 30 is shaved from the inner side 34. In FIG. 1, the bonded portion 52 of the frame top plate 50 on the frame upper end is a region between a dotted line 56 and four surrounding sides 57, while the protruding portions 54 are narrow regions between the dotted line 56 and the four inner sides 58.

Cross sections connecting the protruding portions 54 of the frame top plate 50 to the elastic support arms 10 have the same areas as the cross section of the elastic support arms and are about 660 $μm^2$ in this embodiment. Cross section of the frame top plate 50 on a boundary between the bonded portion 52 and the protruding portion 54 is about 14,400 $μm^2$ in area, since its thickness is about 6 μm and its length is about 2,400 μm, in precise it is about 2,420 μm obtained from the addition of the groove depth on both sides. So, the cross section of the frame top plate 50 on the boundary between the bonded portion 52 and the protruding portion 54 is larger than the cross section of the elastic support arm.

When an acceleration sensor is subjected to an impact or an acceleration, a mass portion/a thick support frame is swung right and left, back and forth or up and down against its elastic support arms or twisted to cause the elastic support arms to bend or twist. When the bending or the twist is rapid or a large deformation is caused, the elastic support arms may be broken. Since the elastic support arms are made very thin as explained above, strains caused by the impact or the acceleration tend to concentrate on the roots where the elastic support arms are fixed to the mass portion or the frame. It results that the elastic support arms cannot withstand stress due to the strains to break at the roots.

As explained before, in the mass portion top plate 40 of the invention, the cross sections of the mass portion top plate 40 on the boundary between the portion 42 bonded to the mass portion upper end 22 and the portions 44 protruding toward the elastic support arms 10 from the bonded portion 42 are larger than the cross sections connecting the protruding portions 44 to the elastic support arms 10. Also, in the frame top plate 50, the cross sections of the top plate 50 on the boundary between the portion 52 bonded to the frame upper end 32 and the portions 54 protruding toward the elastic support arms 10 from the bonded portion 52 are larger than those connecting the protruding portions 54 to the elastic support arms 10. By this reason, when the mass portion 20 or the thick support frame 30 is moved against the elastic support arms 10 by an impact or an acceleration applied to the acceleration sensor, the strain of the bending or the twist caused on the elastic support arms 10 is transmitted first to the cross sections connecting the protruding portions 44, 54 of the top plates 40, 50 to the elastic support arms 10 and then the cross sections of the top plates 40, 50 on the boundaries between the protruding portions 44, 54 and the bonded portions 42, 52 of the top plates 40, 50 through the protruding portions 44, 54. Deformations caused on the mass portion 20 and the thick support frame 30 are transmitted through a reversed route, that is, the deformations are transmitted from the cross sections of the top plates 40, 50 on the boundary between the protruding portions 44, 54 and the bonded portions 42, 52 of the top plates 40, 50 to the cross sections connecting the protruding portions 44, 54 of the top plates 40, 50 to the elastic support arms 10 through the protruding portions 44, 54. As described here, the transmission of the strain is not carried out directly between the elastic support arms 10 and the mass portion 20 or the thick support frame 30, but it is carried out through the protruding portions 44, 54 of the top plates 40, 50. By the reason and because the protruding portions 44, 54 have larger cross sections connecting the bonded portions 42, 52 than those connecting the elastic support arms 10, the strains or stress is released in the protruding portions 44, 54, so that in the acceleration sensor element according to the invention, the breakage of the elastic support arms can be prevented or at least alleviated even if a large impact or acceleration is applied.

In this embodiment, in the mass portion 20, the protruding portion 44 of the mass portion top plate 40 is provided by the lateral groove 72 formed on the side surface 24 of the mass portion along the boundary between the mass portion upper end 22 and the mass portion top plate 40. Also, in the thick support frame 30, the protruding portion 54 of the frame top plate 50 is provided by the lateral groove 74 formed on the inner side surface 34 of the frame along the boundary between the frame upper end 32 and the frame top plate 50. The lateral groove 72 formed on the mass portion side surface 24 is about 1,000 μm long, about 10 μm wide and about 10 μm deep, while the lateral groove 74 formed on the frame inner side surface 34 is about 2,400 μm, about 10 μm wide and about 10 μm deep. These grooves 72, 74 are desirably equal to or longer than the width of the elastic support arm 10. Also, the grooves 72, 74 are desirably 1 μm wide or wider, but in practice it is more preferable that the width is less than 30 μm. The depth of the grooves 72, 74 is desirably 1 μm or more, but it is more preferably less than 100 μm. It may be understood that the grooves should have the length equal to or longer than the width of the elastic support arms, because the protruding portions of the top plates are defined by the grooves. Even if the groove has the length equal to the support arm width, the boundaries between the protruding portion and the bonded portion of the top plate have a larger area than a boundary area between the protruding portion and the elastic support arm, since the boundaries between the protruding portion and the bonded portion is constituted of cross sections on the three sides of the protruding portion, except for the boundary with the elastic support arm. It is convenient for manufacturing that the grooves 72, 74 have the same width as the thickness of the $SiO_2$ insulating layer 70, since the grooves 72, 74 are formed by shaving the $SiO_2$ insulating layer 70 of the SOI wafer from the mass portion side surface/the frame inner side surface in the acceleration sensor element 100 of the first embodiment explained above. In the case that the acceleration sensor element of the invention is made from an SOI wafer having 1 to 10 μm thick $SiO_2$ insulating layer, which is commercially available, the groove width can be determined by the thickness of the $SiO_2$ insulating layer. But, as explained later, it may have a width more than 10 μm. Too wide groove, however, may lead to reduction of the strength in the support frame and decreasing of the weight of the mass portion. Also, it may take a long machining time. It is preferable that the groove width is at most 30 μm. When the groove depth is 1 μm or more, a sensor can withstand twice impact in comparison to that without grooves. A sensor having grooves as deep as 150 μm is not different in impact-resistance from that having grooves of 1 μm deep. But, if grooves deeper than 100 μm are formed on the mass portion, the mass portion becomes light to reduce the sensitivity of the acceleration sensor, while the thick support frame having grooves deeper than 100 μm will not lead to the reduction of the sensitivity, but it will reduce the strength of the frame. Since it takes a long machining time to form grooves deeper than 100 μm, it is preferable that the groove is at most 100 μm deep.

A production process of the acceleration sensor element of the embodiment will be explained below. FIG. 7 shows part (left half) of a section in the X-axis direction (cross section taken along the line VII—VII of FIG. 1) of the acceleration sensor element 100 in FIG. 1 to explain a main process. An SOI wafer is a Si single crystal substrate constructed with a Si base substrate 80, a silicon single crystal layer 90 on the top surface, which is a Si active layer, and a $SiO_2$ insulating layer 70, which is between the Si base substrate 80 and the silicon single crystal layer 90, and is used as an etching stopper, as denoted by reference numerals in FIG. 7A. As for the thickness thereof, the base substrate 80 has thickness of about 600 μm, $SiO_2$ insulating layer 70 has thickness of about 10 μm and the silicon single crystal layer 90 has thickness of about 6 μm.

Figure 7A:
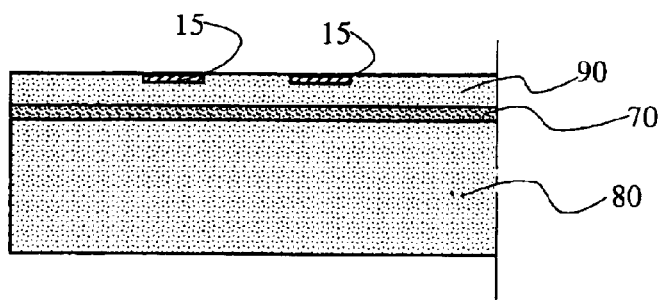
FIGS. 7A through 7F are cross sectional views taken along the line VII—VII of FIG. 1 for explaining a process of manufacturing the acceleration sensor element of the first embodiment.

The first step of the production process is to make a pattern of a predetermined form with a photoresist or thermally oxidized $SiO_2$ film or the like on the surface of the silicon single crystal layer 90 and to make piezoresistors 15 with boron being diffused by an impurity diffusion process such as ion implantation (FIG. 7A). As surface impurity density, about $2\times10^{18}$ atoms/cm$^3$ is adopted, from the viewpoint of both the temperature characteristics and sensitivity.

Figure 7B:
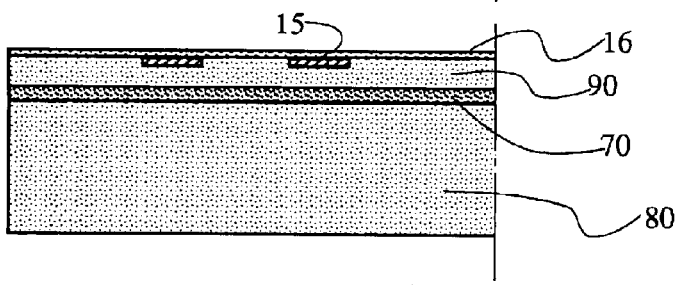

Next, to protect the piezoresistors 15, a protection film 16 is produced (FIG. 7B). As the protection film 16, a multilayer film of $SiO_2$ and PSG (Phosphorous silicated glass) that are generally used in a semiconductor technology are used to have a getting effect of movable ion. Instead of the two-layer film of $SiO_2$ and PSG, a two-layer film of $SiO_2$ and SiN may be used. It is preferable that the thickness of the protection film 16 is made as thin as possible to decrease stress in terms of high sensitivity, and therefore it is made 0.2 μm to 0.5 μm.

Figure 7C:
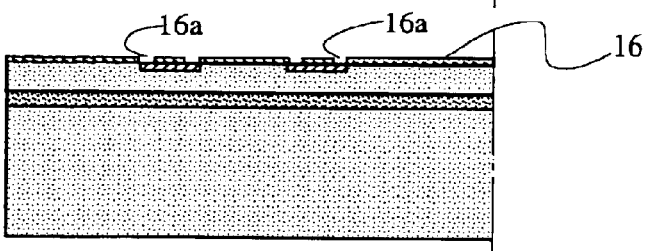

Next, through-holes 16a for connecting electrodes are formed in the protection film 16 on both ends of the piezoresistors 15 by a wet etching with hydrofluoric acid as a predominant ingredient (FIG. 7C).

Figure 7D:
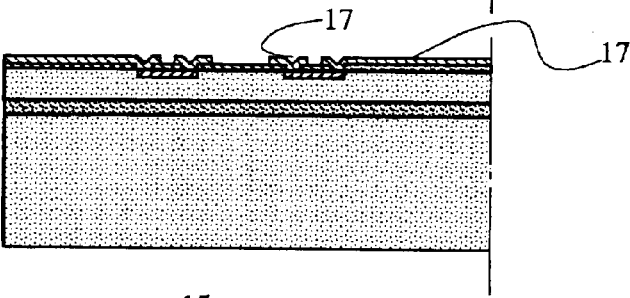

Next, to make electrode wiring, a film of aluminum alloy (aluminum, copper, silicon and the like are main ingredients) is formed by spattering. The thickness is 0.3 μm to 0.5 μm. Lead electrodes 17 are formed by photo etching (FIG. 7D).

Next, though not shown, the silicon single crystal layer 90 is etched by a dry etching method or the like to form a through-hole pattern 60 to the thin portion shown in FIG. 1.

Figure 7E:
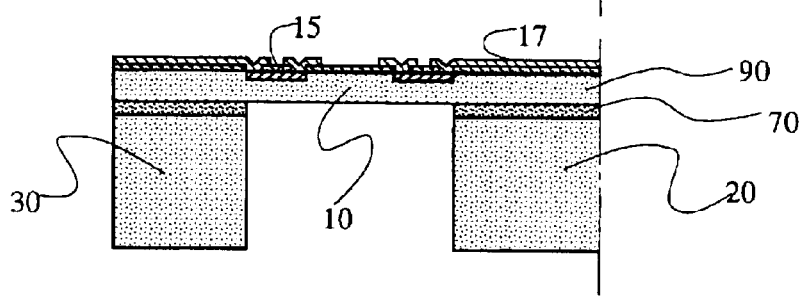
Figure 7F:
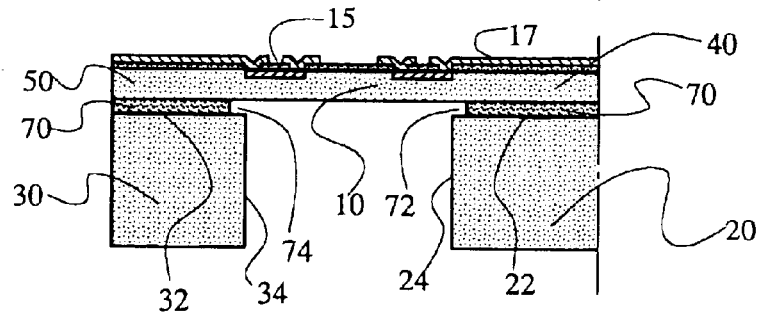

Next, on the base substrate 80 on the back surface a photoresist mask is formed in the shapes of the mass portion 20 and the frame 30 with the positions of the piezoresistors 15 on the surface, the through-hole pattern 60 to the silicon single crystal layer 90 and the like are aligned with use of a double-side aligner device, the base substrate 80 is etched by the dry etching method in plasma containing $SF_6$-gas and oxygen, and the $SiO_2$ insulating layer 70 as the etching stopper is removed by wet etching (FIG. 7E). In the etching step, the $SiO_2$ insulating layer 70 is overetched to remove part of the $SiO_2$ insulating layer 70 until an aimed depth from the side surface 24 of the mass portion and the inner side surface 34 of the frame (FIG. 7F). The elastic support arms 10 and the lateral grooves 72, 74 are made through the step. As an etching solution to etch the $SiO_2$ layer, buffered hydrofluoric acid is used.

Thereafter, a number of acceleration sensor chips formed on the wafer are cut into sensor chips one by one with use of a dicer or the like, and via the assembly process such as packaging and the like, the semiconductor acceleration sensor 100 is completed.

EXAMPLE 2

Figure 8:
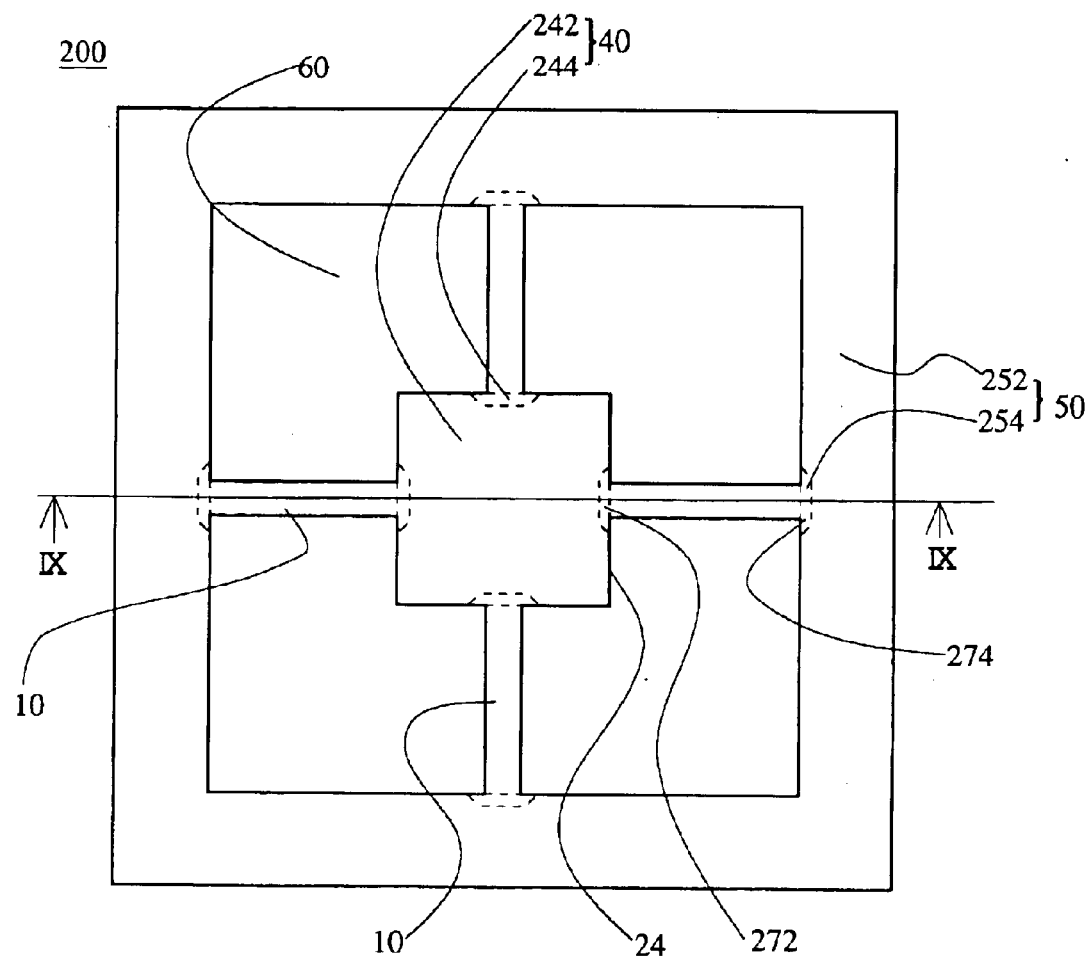
FIG. 8 is a plan view of an acceleration sensor element of a second embodiment of the invention.
Figure 9:
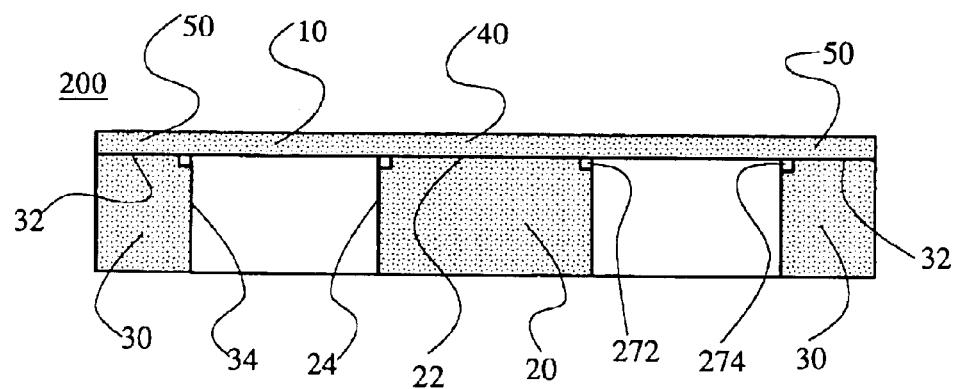
FIG. 9 is a cross sectional view taken along the line IX—IX of FIG. 8.
Figure 10:
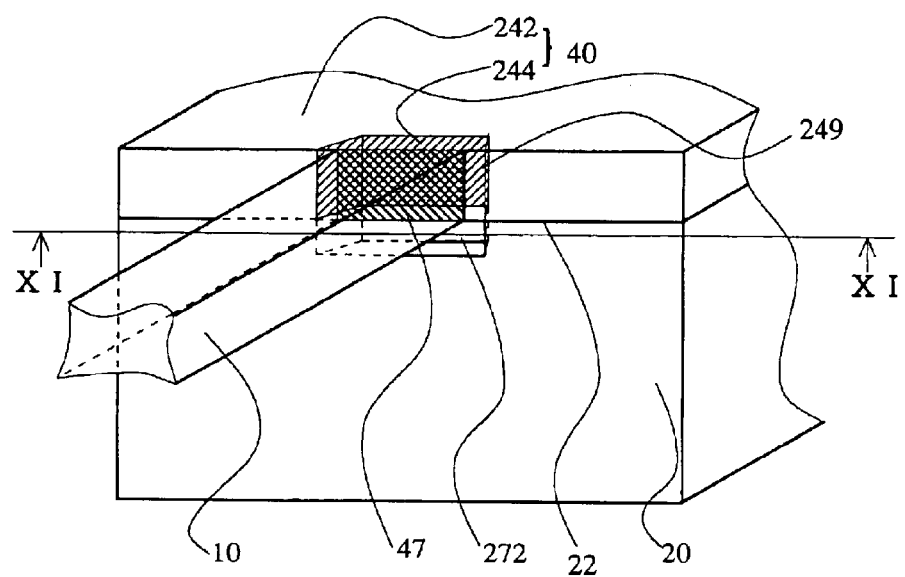
FIG. 10 is an enlarged explanatory perspective view of part of the acceleration sensor element of the second embodiment.
Figure 11:
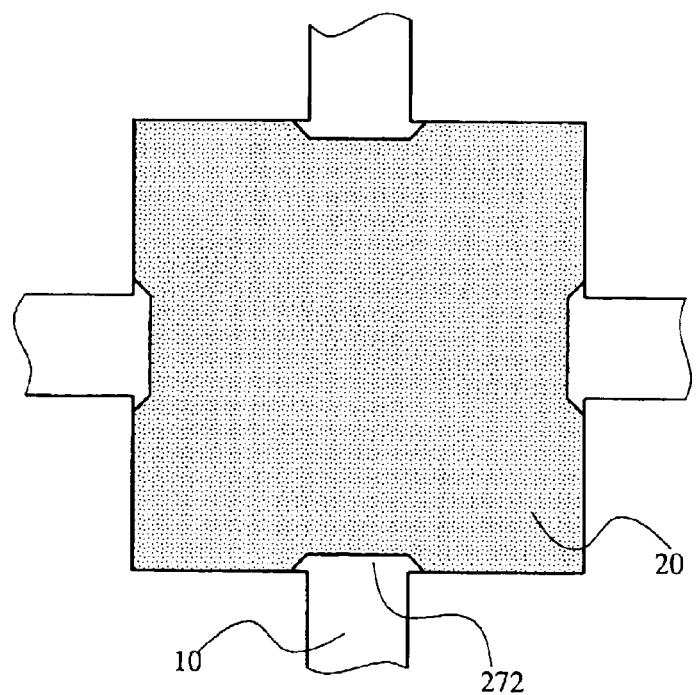
FIG. 11 is an enlarged cross sectional plan view taken along the line XI—XI of FIG. 10.
Figure 12:
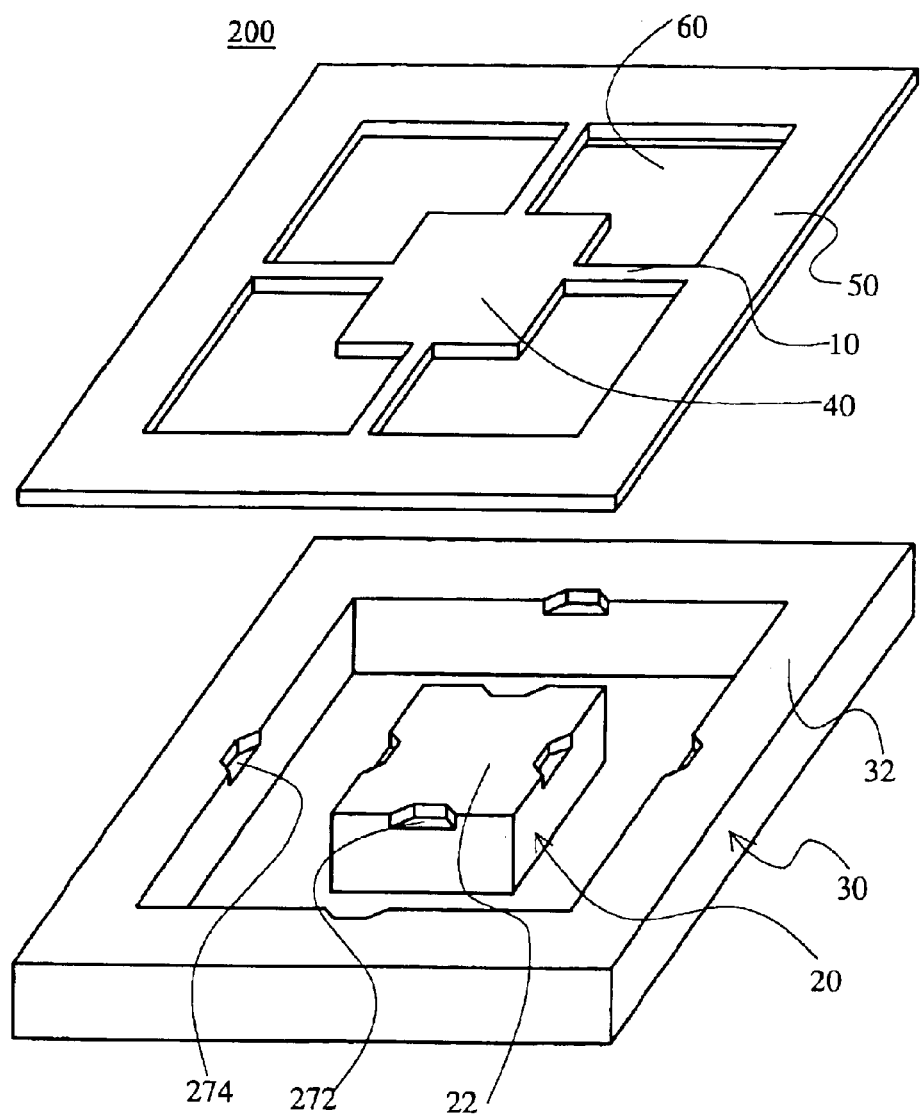
FIG. 12 is an enlarged exploded perspective view showing the acceleration sensor element of the second embodiment.

Referring to FIGS. 8 through 12, an acceleration sensor element of the second embodiment according to the invention will be explained below. FIG. 8 is a plan view of the acceleration sensor element of the second embodiment, FIG. 9 is a cross sectional view taken along the line IX—IX of FIG. 9, FIG. 10 is an enlarged explanatory perspective view of part of the acceleration sensor element, FIG. 11 is an enlarged cross sectional plan view taken along the line XI—XI of FIG. 10 and FIG. 12 is an exploded perspective view of the acceleration sensor element of the second embodiment. In these drawings and the description below about the acceleration sensor element of the second embodiment, like reference numerals are used to refer to like parts.

Although the acceleration sensor element 200 of the second embodiment is almost the same as the acceleration sensor element 100 of the first embodiment, the sensor element 200 does not have an $SiO_2$ insulating layers the first embodiment has between the mass portion and the mass portion top plate and between the thick frame and the frame top plate, and in the acceleration sensor element 200, a mass portion 20 and a mass portion top plate 40 are bonded together by an organic adhesion layer instead of the $SiO_2$ insulating layer, and a thick support frame 30 and a frame top plate 50 are bonded together by an organic adhesion layer. Also, lateral grooves 272 formed on side surfaces 24 of the mass portion along the boundary between the mass portion top plate 40 and an upper end 22 of the mass portion and lateral grooves 274 formed on inner side surfaces 34 along the boundary between the frame top plate 50 and an upper end 32 of the frame are made to be only a little longer than the width of elastic support arms 10 and do not extend to the whole length of the mass portion side or the frame inner side.

As can be seen from FIGS. 8 and 10 through 12, the lateral grooves 272 and 274 have horizontal cross sections of trapezoid. The mass portion upper end 22 of the square mass portion 20 has a shape formed by excluding the four trapezoidal grooves 272 from a horizontal square cross section of the mass portion, so that the mass portion top plate 40 is constituted of a portion 242 corresponding to the mass portion upper end 22 and bonded to the mass portion upper end 22 and protruding portions 244 each corresponding to each of the four trapezoidal grooves 272. Cross sections of the mass portion top plate 40 on the boundary between the bonded portion 242 and each of the protruding portions 244 of the top plate 40 have cross sectional areas corresponding to the three sides of each of the trapezoidal grooves. Since a cross section of the mass portion top plate 40 between an elastic support arm 10 and the portion 244 protruding toward the elastic support arm 10 has the same cross sectional area as the elastic support arm 10, the cross section is smaller than that of the top plate 40 on the boundary between the bonded portion 242 and the protruding portion 244 of the top plate. The cross section connecting the elastic support arm 10 to the portion 244 of the mass portion top plate 40 protruding toward the elastic support arm 10 is a region 47 hatched with diagonal lines from upper left to lower right in FIG. 10, like in FIG. 5, while the cross section of the top plate 40 on the boundary between the bonded portion 242 and the protruding portion 244 of the top plate 40 is a region 249 hatched with diagonal lines from upper right to lower left. The top plate 50 of the frame fixed onto the upper end 32 of the thick support frame has trapezoidal lateral grooves 274 formed below the elastic support arms 10 as in the same manner as the mass portion top plate 40, so that the top plate 50 is constituted of a bonded portion 252 and protruding portions 254. Cross sections that the protruding portions 254 of the frame top plate 50 have on boundaries with the bonded portion 252 are of the same in area as the cross sections that the protruding portions 244 of the mass portion top plate 40 have on the boundaries with the bonded portion 242 of the mass portion top-plate and are larger in area than the cross section that the protruding portion 254 of the frame top plate 50 on a boundary with the elastic support arm 10. By this reason, even if the acceleration sensor of the second embodiment is subjected to a large impact or acceleration, the strain caused by the impact or acceleration is released in the protruding portions 244 and 254 of the mass portion top plate 40/frame top plate 50 to prevent or at least to alleviate the breakage of the elastic support arms 10.

A process of manufacturing the acceleration sensor element of the second embodiment will be explained below. A top plate comprising the mass portion top plate 40, the four elastic support arms 10 and the frame top plate 50 are integrally made from a silicon thin film of about 6 μm thick. On the other hand, the mass portion 20 and the thick support frame 30 are made from a Si wafer of about 600 μm thick.

First, according to the production steps of FIGS. 7A through 7D showing the manufacturing process of the acceleration sensor element of the first embodiment, a protection film and lead electrodes are formed on the silicon thin film. Then, the silicon thin film is dry etched to form through-holes 60 of the top plate and regions corresponding to the mass portion top plate 40, the four elastic support arms 10 and the frame top plate 60 as shown in the upper half of FIG. 12. In parallel to this process, the Si wafer is dry etched in a plasma containing $SF_6$ gas and oxygen to form the mass portion 20 and the thick support frame 30. They are further etched by a dry etching from the top of them with a photo-resist mask having trapezoidal lateral groove patterns to form the lateral grooves on the mass portion 20 and the frame 30, as shown in the lower half of FIG. 12. The silicon thin film on which the top plates are formed is cut into top plate chips one by one with use of a dicer or the like, as shown in the upper half of FIG. 12. Also, the Si wafer on which the mass portions 20 and the thick support frames 30 are formed is cut into mass portion chips and thick support frame chips one by one with use of a dicer or the like to form mass portions and thick support frames. On the top plate shown in FIG. 12, the mass portion 20 and the thick support frame 30 are bonded together by resinous adhesion agent to form an acceleration sensor chip 200 of this embodiment. Alternatively, after a Si wafer on which a number of mass portions 20 and thick support frames are formed is bonded onto a silicon thin film having a number of top plates with resinous adhesion agent, the acceleration sensor chips on the wafer may be cut into sensor chips 200 one by one with a dicer or the like.

EXAMPLE 3

Figure 13:
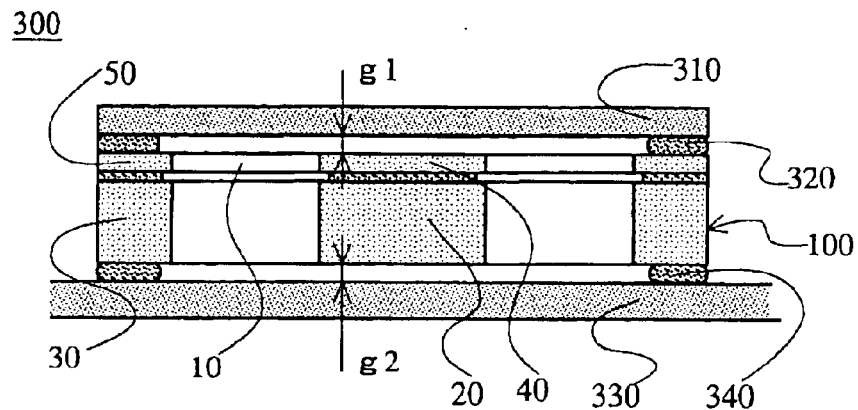
FIG. 13 is a cross sectional view of an acceleration sensor assembled with the semiconductor acceleration sensor element of the first embodiment.

Referring to FIG. 13, an acceleration sensor 300 of the third embodiment assembled with the semiconductor acceleration sensor element 100 of the first embodiment will be explained. FIG. 13 is a cross sectional view of the acceleration sensor.

In the cross sectional view shown in FIG. 13, a first regulation plate 310 made of borosilicate glass of 0.3 mm thick is fixed with paste 320 on each corner of the top surface of the thick support frame top plate 50 to cover the acceleration sensor element 100 explained in the first embodiment. The paste is silicon-rubber resin adhesive, such as DA 6501 from Dow Corning Toray Silicone Co., Ltd., mixed with about 10 mass % of hard plastic balls made of divinylbenzene-based cross-linked copolymer having diameters of approximately 10 μm. The silicon-rubber resin adhesive is elastic enough to absorb the applied impact and shows Young's Modulus less than $8.8 \times 10^{-4}$ G Pa after hardened. The area of the paste 320 at each of the corners of the top surface of the frame top plate 50 is a square of about 350 μm × about 350 μm. The gap g1 between the bottom surface of the first regulation plate 310 and the top surface of the mass portion top plate 40 is about 10 μm. A second regulation plate 330 of borosilicate glass is fixed with the same paste 340 below a bottom surface of the thick support frame 30 of the acceleration sensor element 100 and has a gap (second gap) g2 of about 10 μm between a top surface of the second regulation plate 330 and a bottom surface of the mass portion 20.

Since the displacement of the mass portion 20 is not swung more than the gaps g1 and g2 with the regulation plates 310 and 330 even if the acceleration sensor 300 of the third embodiment having the regulation plates 310 and 330 mounted with the gaps above and below the acceleration sensor element 100 is subjected to a large acceleration, the breakage of the elastic support arms 10 of the acceleration sensor element 100 can be prevented. The gap g1 between the first regulation plate and the top surface of the mass portion top plate and the second gap g2 between the second regulation plate and the bottom surface of the mass portion may be varied within a range of 5 to 15 μm.

EXAMPLE 4

Figure 14:
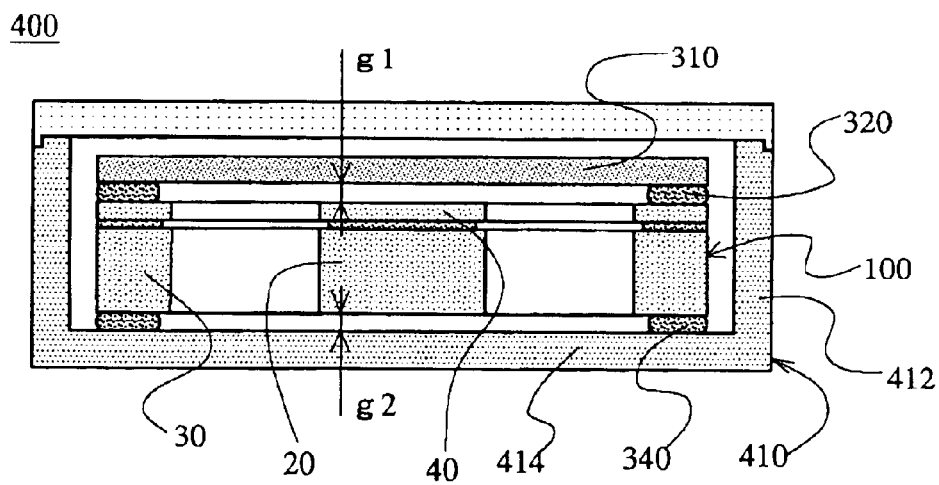
FIG. 14 is a cross sectional view of another acceleration sensor assembled with the semiconductor acceleration sensor element of the first embodiment.

Referring to FIG. 14, an acceleration sensor 400 of a forth embodiment according to the invention will be explained in which a semiconductor acceleration sensor element 100 of the first embodiment is assembled. FIG. 14 is a cross sectional view of the acceleration sensor.

As shown in FIG. 14, the acceleration sensor 400 is installed in a protection case 410 made of alumina or the like, which sensor has a first regulation plate 310 of borosilicate glass of 0.3 mm thick mounted with a predetermined gap g1 with a top surface of the mass portion top plate 40 fixed on the acceleration sensor element 100 by paste 320 like the third embodiment. The protection case 410 is constituted of a side frame 412 and an inner bottom plate 414 on which a bottom surface of a thick support frame 30 of the acceleration sensor element 100 is bonded and fixed with paste 340. The mass portion 20 in the center of the acceleration sensor element 100 does not contact the inner bottom plate 414 and has a second predetermined gap g2 with the bottom plate 414 when the acceleration sensor element 100 is fixed onto the bottom plate. The inner bottom plate restricts a downward swing of the mass portion within the gap g2 with the bottom surface of the mass portion and works as a regulation plate. The second predetermined gap g2 may have a value different from the predetermined gap g1. Also, in this embodiment, the paste used in the third embodiment may be used.

EXAMPLE 5

Figure 15:
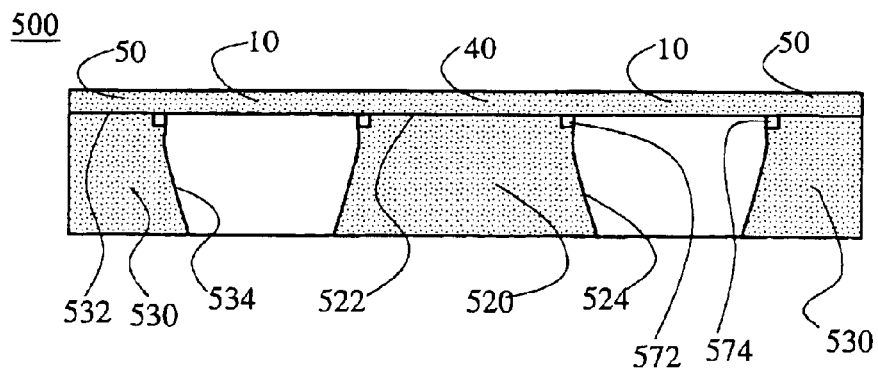
FIG. 15 is a cross sectional view of a modification of the acceleration sensor element of the second embodiment.

Referring to FIG. 15, a modification of the acceleration sensor element of the second embodiment will be explained as a fifth embodiment according to the invention. FIG. 15 is a cross sectional view of the modification of the acceleration sensor element.

The acceleration sensor element 500 of the fifth embodiment shown in FIG. 15 has almost the same structure as the acceleration sensor element of the second embodiment shown in FIGS. 8 through 12, except for the shapes on the outskirts of a mass portion 520 and a thick support frame 530. The acceleration sensor 500 has side surfaces 524 of the mass portion 520 getting wider when going down and inner side surfaces 534 of the thick support frame 530 getting wider when going down. The acceleration sensor 500 can have an enhanced sensitivity and an improved mechanical strength, since the mass portion and the frame of the acceleration sensor 500 can be heavier than those of the acceleration sensor element of the second embodiment even if their upper cross sections are the same as those of the second embodiment. In the acceleration sensor element 500, a mass portion top plate 40 is fixed with adhesive onto an upper end 522 of the mass portion, and a frame top plate 50 is fixed with adhesive onto an upper end 532 of the frame. Elastic support arms 10 bridge the mass portion top plate 40 and the frame top plate 50. The mass portion top plate 40, the frame top plate 50 and the elastic support arms 10 constitute an integral top plate of the acceleration sensor. A region surrounded by four crossing lines between a plane including the mass portion upper end (the plane is the same as a bottom surface of the top plate of the acceleration sensor element.) and planes extended along the side surfaces of the mass portion toward the mass portion top plate from the side surfaces surrounding the mass portion is substantially the same in shape (square in this embodiment) and in area as a surface of the mass portion top plate facing the mass portion upper end (square in this embodiment, like in the second embodiment), that is, a bottom surface of the mass portion top plate. And, a region interposed between four crossing lines (forming a square in this embodiment) of a plane including the upper end of the thick support frame (the plane is the same as the bottom surface of the top plate of the acceleration sensor.) with planes extended along the inner side surfaces toward the frame top plate from the inner side surfaces of the frame and four crossing lines (forming a square in this embodiment) of a plane including the frame upper end (the plane is the same as the bottom surface of the top plate of the acceleration sensor.) with planes extended along outer surfaces of the frame toward the frame top plate from the outer surfaces of the frame is the same in shape and in size as a surface of the frame top plate facing the upper end of the thick support frame, that is, a bottom surface of the frame top plate.

In the acceleration sensor element 500 of the fifth embodiment, there are provided lateral grooves 572 along the boundary between the mass portion top plate 40 and the mass portion upper end 522 just below the elastic support arms 10 on the mass portion side surfaces 524. Also, lateral grooves 574 are provided along the boundary between the top plate 50 of the thick support frame and the frame upper end 532 just below the elastic support arms 10 on the inner side surfaces 534 of the thick support frame. Those lateral grooves 572 and 574 are formed a little longer than the width of the elastic support arms 10 adjacent to the grooves. The lateral grooves are preferably 1 to 30 μm in width and 1 to 100 μm in depth.

By the grooves formed on the mass portion, portions protruding toward the elastic support arms are provided on the mass portion top plate. The mass portion top plate is constituted of the protruding portions and a portion bonded onto the upper end of the mass portion. A cross section between each of the protruding portions and the bonded portion is larger than that connecting the protruding portion to the elastic support arm. In the same manners as the mass portion, portions protruding toward the elastic support arms are provided on the frame top plate by lateral grooves formed on the thick support frame. The frame top plate has the protruding portions and a portion bonded onto the frame upper end. A cross section between each of the protruding portions and the bonded portion of the frame top plate is larger than that connecting the protruding portion to the elastic support arm.

Although the mass portion and the thick support frame have structures getting a thicker cross section when going down in this embodiment, the acceleration sensor element may have another structure like a structure having the thickest cross section in a midpoint between the top and the bottom of them.

EXAMPLE 6

Influence of Groove Dimensions on Sensitivity and Impact-Resistance

In the acceleration sensor 400 mounted in the protection case 410 explained as the forth embodiment, influence of lateral groove dimensions on sensitivity and impact-resistance of acceleration sensors were studied, varying the dimension of the lateral grooves. The acceleration sensor elements used in the acceleration sensors had a square thick support frame of about 3,300 μm in side length, about 600 μm in thickness and about 450 μm in width. The mass portions of the sensor elements were a square of about 1,000 μm × about 1,000 μm and about 600 μm in thickness. The elastic support arm was about 700 μm in length, about 110 μm in width and about 6 μm in thickness. The mass portion top plate had the same square of about 1,000 μm × about 1,000 μm as the mass portion and was about 6 μm in thickness, and the frame top plate had the same planar dimensions as the frame and was about 6 μm in thickness.

Influence of Groove Depth

Using an acceleration sensor element 200 of the second embodiment having the same dimensions as explained above, an acceleration sensor 400 of the forth embodiment was prepared, and the influences of the groove dimensions on the sensitivity were examined, varying the depth of the lateral groove from 0 μm to 150 μm with a fixed length of 200 μm and a fixed width of 2 μm.

An output voltage of the acceleration sensor was measured as the sensitivity while an acceleration of 2 G was applied to the sensor. In order to study the impact-resistance, after an acceleration sensor was gravity dropped from various heights onto a cryptomeria board having a thickness of 100 mm, impact-resistance values were obtained from a maximum dropping height at which an output voltage was obtained after gravity dropping. A relationship between gravity dropping heights and impacts were measured before the test and the strength of impact was calculated from a dropping height by a calibration curve of the relationship. In the test, a conventional acceleration sensor without grooves were named as a groove depth 0 μm.

Figure 16:
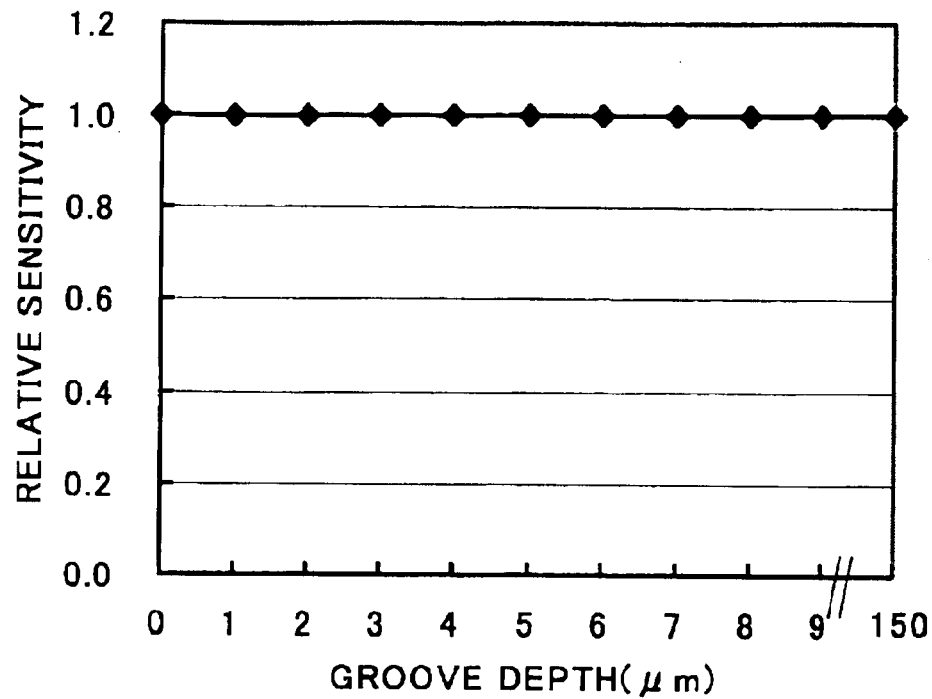
FIG. 16 is a graph showing the relationship of relative sensitivity of acceleration sensors with groove depth of lateral grooves.
Figure 17:
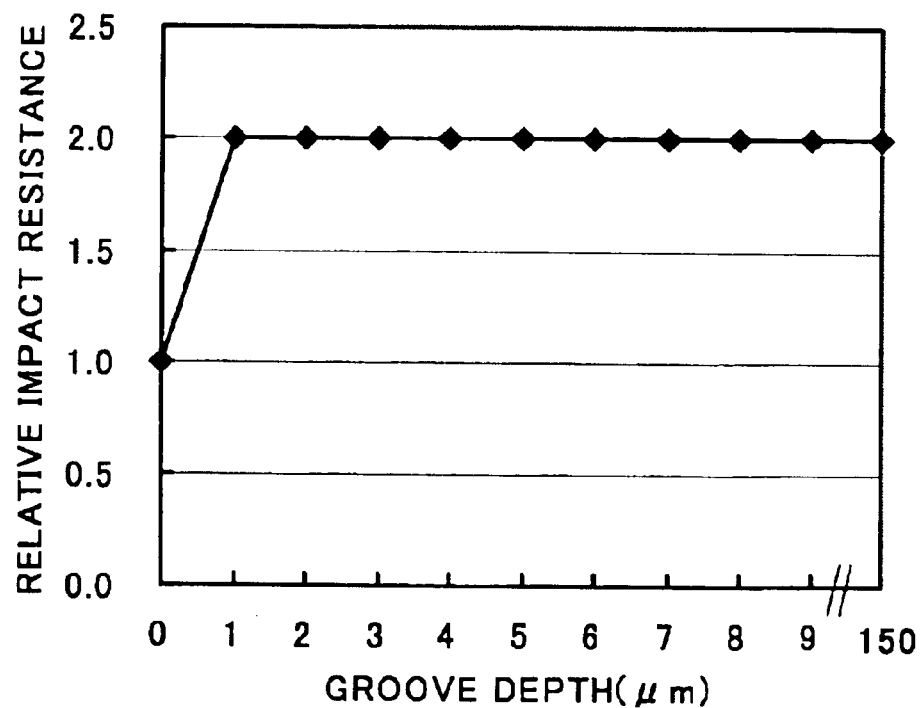
FIG. 17 is a graph showing the relationship of relative impact-resistance of acceleration sensors with groove depth of lateral grooves.

The measurement results are shown in FIG. 16 and FIG. 17. FIG. 16 is a graph showing relative sensitivities of the acceleration sensors vs. groove depth on the abscissa. The relative sensitivity is a ratio of the sensitivity of the acceleration sensor prepared with various groove depth of the invention to the sensitivity of a conventional acceleration sensor having groove depth 0 μm when the sensitivity of the conventional acceleration sensor is fixed at 1.0. It can be seen from FIG. 16 that the sensitivity is not changed until groove depth of 150 μm. FIG. 17 is a graph showing relative impact-resistance of the acceleration sensor prepared with various groove depth vs. groove depth on the abscissa, when the impact-resistance of the conventional acceleration sensor with groove depth 0 μm is fixed at 1.0. The impact-resistance becomes twice that of the conventional acceleration sensor, when the groove depth reaches 1 μm, and is maintained unchanged until the groove depth of 150 μm. But, it was observed that there were some acceleration sensors in which a mass portion was peeled out of a mass portion top plate when their groove depth was more than 100 μm. Also, it took a very long time to machine the groove deeper than 100 μm by etching the $SiO_2$ insulating layer from a side surface of the mass portion to form the groove. As a conclusion, the groove depth more than 1 μm is needed and the depth is preferably less than 100 μm.

Influence of Groove Width

Figure 18:
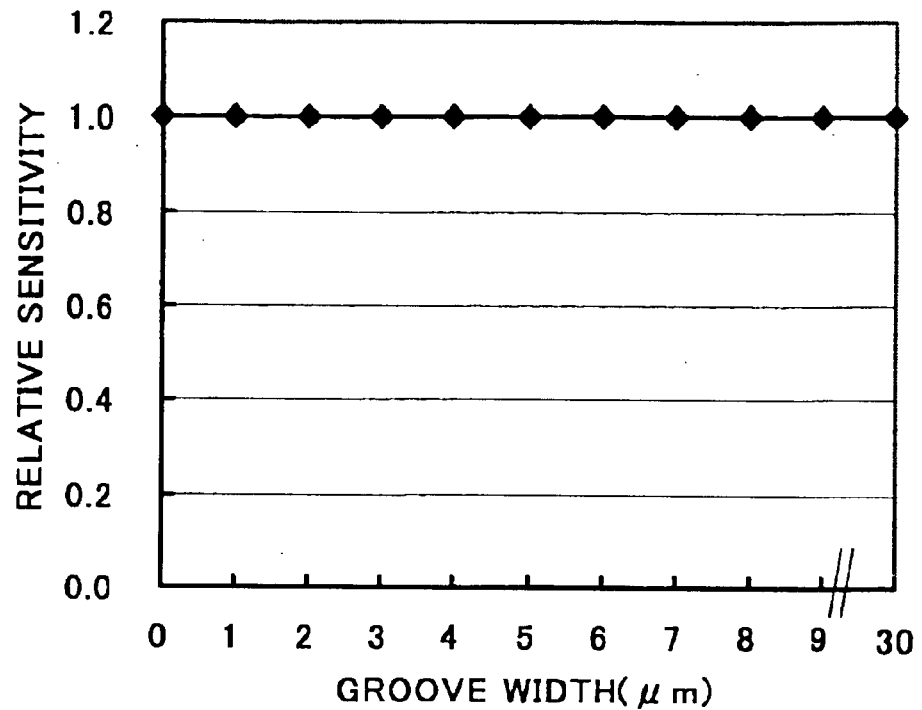
FIG. 18 is a graph showing the relationship of relative sensitivity of acceleration sensors with groove width of lateral grooves.
Figure 19:
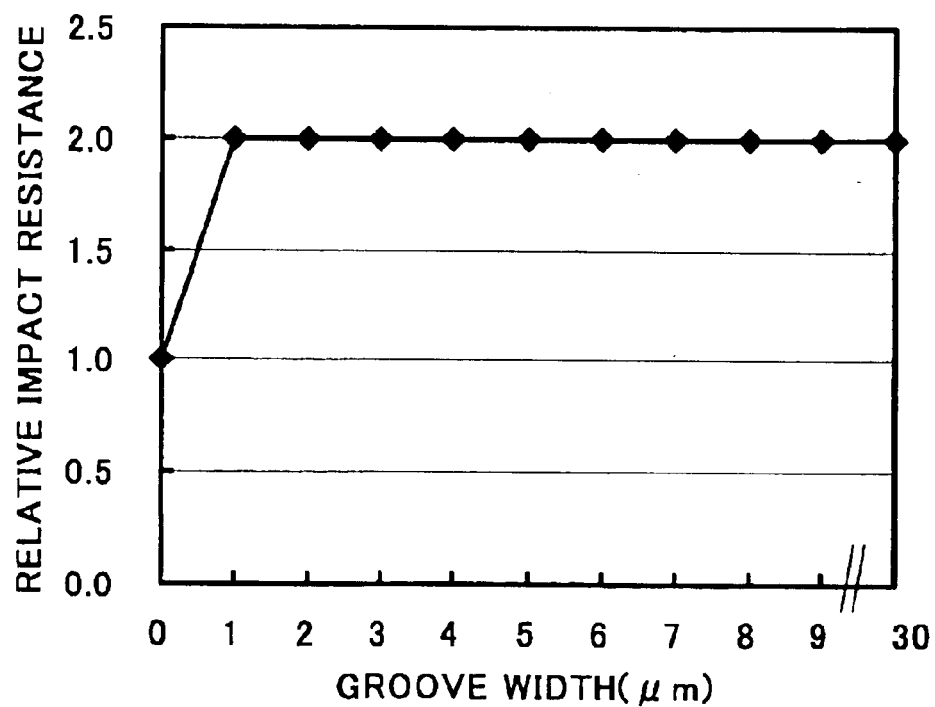
FIG. 19 is a graph showing the relationship of relative impact-resistance of acceleration sensors with groove width of lateral grooves.

The acceleration sensors 400 of the forth embodiment were manufactured, using acceleration sensor elements 100 and 200 of the first embodiment and the second embodiment having the dimensions explained above. The lateral grooves extended to the whole side length of the mass portion side surfaces and the frame inner side surfaces and had a depth of about 5 μm. For the convenience of manufacturing, in sensor elements having groove width less than 10 μm, the groove width was defined by a thickness of the $SiO_2$ insulating layer as in the first embodiment, while in sensor elements having groove width of 10 μm or more the groove was formed by dry etching a Si wafer as shown in the second embodiment. Relative sensitivities and relative impact-resistances were examined with the acceleration sensors having lateral grooves of a various groove width of 30 μm or narrower and the measurement results of them are shown in FIG. 18 and FIG. 19, respectively. In these graphs, a conventional acceleration sensor is denoted by groove depth 0 μm. FIG. 18 shows that the sensitivity is not changed until the groove width of 30 μm. In FIG. 19, the groove width of 1 μm shows twice the impact-resistance of the conventional acceleration sensor and the impact-resistance is maintained unchanged until the groove width of 30 μm.

Although the sensitivity and the impact-resistance are not changed even when the acceleration sensor exceeds 30 μm in groove width, a wider groove may result in the reduction of the weight of the mass portion and in the decrease of the frame strength. Also, a wider groove needs a longer time to machine the grooves. By the reasons, the groove width is preferably 1 μm or more and less than 30 μm.

Influence of Groove Length

Figure 20:
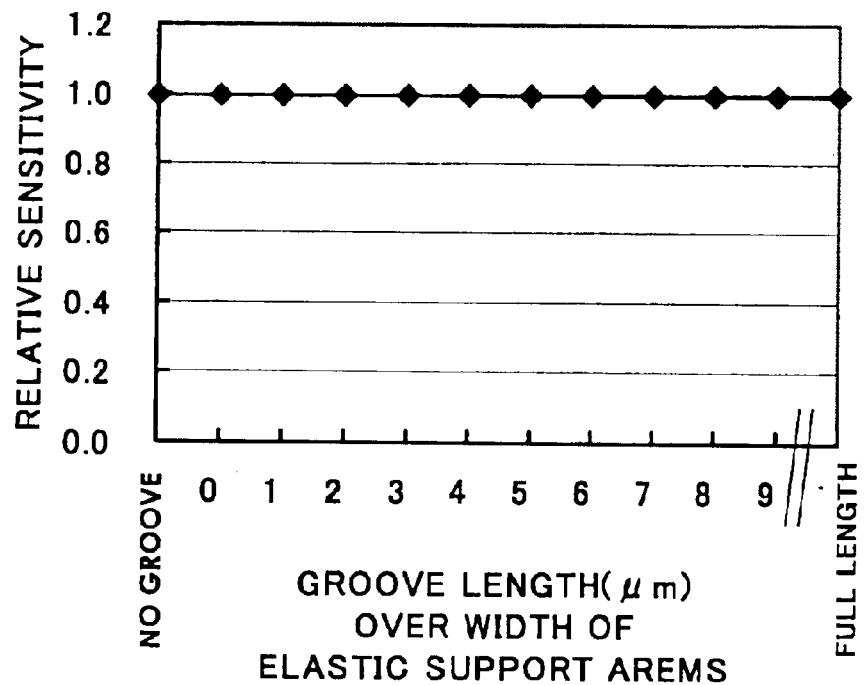
FIG. 20 is a graph showing the relationship of relative sensitivity of acceleration sensors with lateral groove length longer than the width of the elastic support arms.
Figure 21:
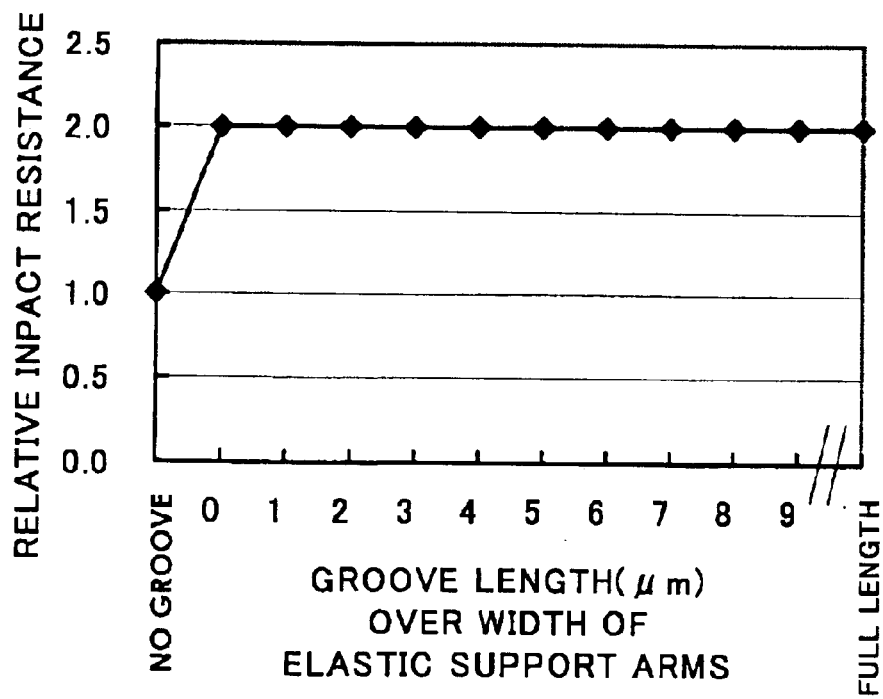
FIG. 21 is a graph showing the relationship of relative impact-resistance of acceleration sensors with lateral groove length longer than the width of the elastic support arms.

Using acceleration sensor elements 100 explained in the first embodiment and having the dimensions above, acceleration sensors 400 of the forth embodiment were manufactured. The lateral grooves were 1 μm wide and 10 μm deep and had length of 0 to 9 μm longer than the width of the elastic support arms or extended to the full side length of the mass portion side surfaces and the frame inner side surfaces. In order to change the length of the lateral grooves, the length of masks for etching the $SiO_2$ insulating layer was changed. Relative sensitivities and relative impact-resistances of the acceleration sensors having a various length of the grooves were examined as explained above and the measurement results are shown in FIG. 20 and FIG. 21. In these graphs, the conventional acceleration sensors are denoted as "no groove". FIG. 20 shows that the sensitivity is not changed until groove length of full length. In FIG. 21, the impact-resistance becomes twice that of the conventional acceleration sensor with "no groove", when the groove length is the same as the width of the elastic support arm (equivalent to 0 μm over the width of the elastic support arm), and is maintained unchanged until the groove length of full length.

From the results of the tests, it is apparent that the groove length equal to or more than the width of the elastic support arm improves the impact-resistance.

EXAMPLE 7

In order to confirm the advantages of the invention, 1000 acceleration sensors (Invention Sensors 1) of the forth embodiment were prepared in which acceleration sensor elements of the first embodiment having the dimensions explained in EXAMPLE 6 were assembled. The lateral grooves had length extending to full side length of the mass portion side surface and the frame inner side surface and were 10 μm in depth and 3 μm in width. The gap g1 between the first regulation plate and the top surface of the mass portion top plate and the gap g2 between the second regulation plate and the bottom surface of the mass portion were about 10 μm. Also, 1000 acceleration sensors (Invention Sensors 2) of the forth embodiment, in which acceleration sensor elements of the second embodiment were assembled, were prepared. The dimensions of the lateral grooves and the gaps with the regulation plates in the Invention Sensors 2 were the same as the Invention Sensors 1. In comparison with these, 200 acceleration sensors as shown in the forth embodiment, in which acceleration sensor elements of the first embodiment but without lateral grooves were assembled, were prepared as Comparison Sensors. The Comparison Sensors were the same in structure and in dimensions as the Invention Sensors 1 except for no grooves.

Output voltages of the Invention Sensors 1, the Invention Sensors 2 and the Comparison Sensors were measured as sensitivity, while an acceleration of 2 G was applied to each of them. All of them showed the same output voltages and their sensitivities were the same.

Next, after each of the acceleration sensors were gravity dropped from a 1 meter height onto a cryptomeria board of 100 mm thick, impact-resistance was evaluated by an output voltage. The sensors showing no output after dropped in the impact test were 113 among 200 Comparison Sensors, 0 among 1000 Invention Sensors 1 and 2 among 1000 Invention Sensors 2. By detailed examinations of the two Invention Sensors 2 that did not give output after the impact test, it was revealed that the adhesive was squeezed out into the grooves of the mass portions and fixed the elastic support arms to the mass portion. The grooves under the mass portion top plate were filled by the squeezed adhesive, resulting in no protruding portion of the top plate. As is apparent from the test results, the acceleration sensors of the invention are extremely superior in impact-resistance.

EXAMPLE 8

As still another embodiment of the invention, an acceleration sensor element having a mass portion of the second embodiment made of titanium was assembled in an acceleration sensor of the forth embodiment. The acceleration sensor had the same dimensions as the Invention Sensors 2 of EXAMPLE 7. The sensor showed a sensitivity of about 70% more than the Invention Sensors 2 of EXAMPLE 7. By the impact-resistance test in which impact-resistance was evaluated by a gravity dropping from a various height like in EXAMPLE 6, it became apparent that the titanium mass portion showed the same impact-resistance as the acceleration sensor of the forth embodiment in which an acceleration sensor element of the second embodiment having a silicon-made mass portion was assembled, while it could withstand twice impact in comparing with a conventional acceleration sensor.

What is claimed is:

1. An acceleration sensor comprising an acceleration sensor element which comprises:
   a mass portion located in a center of the acceleration sensor element;
   top plate of the mass portion fixed on an upper end of the mass portion;
   a rectangular thick support frame surrounding and being at a distance from the mass portion;
   a top plate of the frame fixed on an upper end of the frame;
   four elastic support arms bridging the mass portion top plate and the frame top plate and hanging the mass portion in a center of the frame; and
   strain gauges formed on the elastic support arms;

the mass portion top plate having a portion bonded to the mass portion upper end and a portion protruding toward each of the elastic support arms from the bonded portion of the mass portion top plate, so that a cross section of the mass portion top plate on a boundary between the bonded portion and the protruding portion is larger than a cross section connecting the protruding portion to the elastic support arm; and the frame top plate having a portion bonded to the frame upper end and a portion protruding toward each of the elastic support arms from the bonded portion of the frame top plate, so that a cross section of the frame top plate on a boundary between the bonded portion and the protruding portion is larger than a cross section connecting the protruding portion to the elastic support arm.

2. An acceleration sensor as set forth in claim 1, wherein the protruding portion of the mass portion top plate is formed from the mass portion top plate by a first groove provided on each of a plurality of side surfaces of the mass portion neighboring on the upper end of the mass portion along the mass portion top plate between the mass portion top plate and the mass portion upper end, and the protruding portion of the frame top plate is formed from the frame top plate by a second groove provided on each of a plurality of inner side surfaces of the frame neighboring on the upper end of the frame along the frame top plate between the frame top plate and the frame upper end.

3. An acceleration sensor as set forth in claim 2, wherein a surface of the mass portion top plate facing the mass portion upper end is substantially the same in shape and in area as a region surrounded by crossing lines of a plane including the mass portion upper end with planes extended along the side surfaces of the mass portion toward the mass portion top plate from the side surfaces of the mass portion, and a surface of the frame top plate facing the frame upper end is substantially the same in shape and in area as a region provided between crossing lines of a plane including the frame upper end with planes extended along the inner side surfaces of the frame toward the frame top plate from the inner side surfaces of the frame and crossing lines of a plane including the frame a surface of the square frame top plate facing the frame upper end is substantially the same in shape and in area as a cross section of other part of the square frame than the grooves on the frame, the cross section being parallel to the upper end of the frame.

4. An acceleration sensor as set forth in claim 2, wherein each groove is equal to or longer than the width of the elastic support arm neighboring on the groove, and is 1 to 30 $\mu$m wide and 1 to 100 $\mu$m deep.

5. An acceleration sensor as set forth in claim 3, wherein each groove is equal to or longer than the width of the elastic support arm neighboring on the groove, and is 1 to 30 $\mu$m wide and 1 to 100 $\mu$m deep.

6. An acceleration sensor comprising an acceleration sensor element which comprises:
a square mass portion located in a center of the acceleration sensor element;
a square top plate of the mass portion fixed on an upper end of the mass portion;
a square thick support frame surrounding and being at a distance from the mass portion;
a square top plate of the frame fixed on an upper end of the frame;

four elastic support arms bridging the mass portion top plate and the frame top plate and hanging the mass portion in a center of the frame; and strain gauges formed on the elastic support arms;

the mass portion top plate having a portion bonded to the mass portion upper end and a portion protruding toward each of the elastic support arms from the bonded portion of the mass portion top plate, so that a cross section of the mass portion top plate on a boundary between the portion top plate, so that a cross section of the mass portion top plate on a boundary between the bonded portion and the protruding portion is larger than a cross section connecting the protruding portion to the elastic support arm; and the frame top plate having a portion bonded to the frame upper end and a portion protruding toward each of the elastic support arms from the bonded portion of the frame top plate, so that a cross section of the frame top plate on a boundary between the bonded portion and the protruding portion is larger than a cross section connecting the protruding portion to the elastic support arm;

a first regulation plate mounted with a predetermined gap with the mass portion top plate to cover the acceleration sensor element and fixed on a top surface of the frame top plate by a paste; and a second regulation plate to which a bottom surface of the frame is bonded by the paste with a second predetermined gap between a bottom surface of the mass portion and a top surface of the second regulation plate;

wherein the paste is a mixture of hard plastic balls with adhesive.

7. An acceleration sensor as set forth in claim 6, wherein the protruding portion of the mass portion top plate is formed from the mass portion top plate by a first groove provided on each of a plurality of side surfaces of the mass portion neighboring on the upper end of the mass portion along the mass portion top plate between the mass portion top plate and the mass portion upper end, and the protruding portion of the frame top plate is formed from the frame top plate by a second groove provided on each of a plurality of inner side surfaces of the frame neighboring on the upper end of the frame along the frame top plate between the frame top plate and the frame upper end.

8. An acceleration sensor as set forth in claim 7, wherein a surface of the square mass portion top plate facing the mass portion upper end is substantially the same in shape and in area as a cross section of other part of the square mass portion than the grooves on the mass portion, the cross section being parallel to the upper end of the mass portion, and upper end with planes extended along outer side surfaces of the frame toward the frame top plate from the outer side surfaces of the frame.

9. An acceleration sensor as set forth in claim 7, wherein each groove is equal to or longer than the width of the elastic support arm neighboring on the groove, and is 1 to 30 $\mu$m wide and 1 to 100 $\mu$m deep.

10. An acceleration sensor as set forth in claim 8, wherein each groove is equal to or longer than the width of the elastic support arm neighboring on the groove, and is 1 to 30 $\mu$m wide and 1 to 100 $\mu$m deep.

11. An acceleration sensor comprising:
an acceleration sensor element which comprises:
a mass portion located in a center of the acceleration sensor element, a top plate of the mass portion fixed on an upper end of the mass portion, a rectangular thick support frame surrounding and being at a distance from the mass portion, a top plate of the frame fixed on an upper end of the frame, four elastic support arms bridging the mass portion top plate and the frame top plate and hanging the mass portion in a center of the frame, and strain gauges formed on the elastic support arms, the mass portion top plate having a portion bonded to the mass portion upper end and a portion protruding toward each of the elastic support arms from the bonded portion of the mass bonded portion and the protruding portion is larger than a cross section connecting the protruding portion to the elastic support arm, and the frame cop plate having a portion bonded to the frame upper end and a portion protruding toward each of the elastic support arms from the bonded portion of the frame top plate, so that a cross section of the frame top plate on a boundary between the bonded portion and the protruding portion is larger than a cross section connecting the protruding portion to the elastic support arm.

12. An acceleration sensor as set forth in claim 11, further comprising a protection case having a side frame and an inner bottom plate surrounded by the side frame, wherein the acceleration sensor element is installed in the protection case, the inner bottom plate working as the second regulation plate.

13. An acceleration sensor as set forth in claim 11, wherein the protruding portion of the mass portion top plate is formed from the mass portion top plate by a first groove provided on each of a plurality of side surfaces of the mass portion neighboring on the upper end of the mass portion along the mass portion top plate between the mass portion top plate and the mass portion upper end, and the protruding portion of the frame top plate is formed from the frame top plate by a second groove provided on each of a plurality of inner side surfaces of the frame neighboring on the upper end of the frame along the frame top plate between the frame top plate and the frame upper end.

14. An acceleration sensor as set forth in claim 13, wherein a surface of the mass portion top plate facing the mass portion upper end is substantially the same in shape and in area as a region surrounded by crossing lines of a plane including the mass portion upper end with planes extended along the side surfaces of the mass portion toward the mass portion top plate from the side surfaces of the mass portion, and a surface of the frame top plate facing the frame upper end is substantially the same in shape and in area as a region provided between crossing lines of a plane including the frame upper end with planes extended along the inner side surfaces of the frame toward the frame top plate from the inner side surfaces of the frame and crossing lines of a plane including the frame upper end with surfaces extended along outer side surfaces of the frame toward the frame top plate from the outer side surfaces of the frame.

15. An acceleration sensor as set forth in claim 13, wherein each groove is equal to or longer than the width of the elastic support arm neighboring on the groove, and is 1 to 30 $\mu$m wide and 1 to 100 $\mu$m deep.

16. An acceleration sensor as set forth in claim 14, wherein each groove is equal to or longer than the width of the elastic support arm neighboring on the groove, and is 1 to 30 $\mu$m wide and 1 to 100 $\mu$m deep.

17. The acceleration sensor as set forth in claim 2, wherein said first and second grooves are lateral grooves parallel to said mass portion top plate or to said frame top plate.

18. The acceleration sensor as set forth in claim 7, wherein said first and second grooves are lateral grooves parallel to said mass portion top plate or to said frame top plate.

19. The acceleration sensor as set forth in claim 13, wherein said first and second grooves are lateral grooves parallel to said mass portion top plate or to said frame top plate.

* * * * *